United States Patent
Torek et al.

(10) Patent No.: US 6,562,726 B1
(45) Date of Patent: May 13, 2003

(54) ACID BLEND FOR REMOVING ETCH RESIDUE

(75) Inventors: Kevin J. Torek, Meridian, ID (US); Donald L. Yates, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/342,243

(22) Filed: Jun. 29, 1999

(51) Int. Cl.$^7$ .............................................. H01L 21/302
(52) U.S. Cl. ..................... 438/745; 438/750; 438/753; 134/1.2
(58) Field of Search ................ 438/745, 750, 438/753, 89; 252/79.1, 79.2, 79.3; 134/1.1, 1.2, 1.3; 216/106, 108

(56) References Cited

U.S. PATENT DOCUMENTS

| | | | |
|---|---|---|---|
| 4,314,885 A | 2/1982 | Chang et al. | 134/3 |
| 5,017,513 A * | 5/1991 | Takeuchi | 437/229 |
| 5,175,124 A * | 12/1992 | Winebarger | 438/745 |
| 5,340,437 A | 8/1994 | Erk et al. | 156/345 |
| 5,389,194 A | 2/1995 | Rostoker et al. | 156/345 |
| 5,478,436 A | 12/1995 | Winebarger et al. | 156/345 |
| 5,496,485 A | 3/1996 | Maternaghan | 252/79.3 |
| 5,498,293 A | 3/1996 | Ilardi et al. | |
| 5,698,041 A * | 12/1997 | Woo et al. | 134/3 |
| 5,698,503 A | 12/1997 | Ward et al. | |
| 5,705,089 A * | 1/1998 | Sugihara et al. | 252/79.1 |
| 5,714,203 A * | 2/1998 | Schellenberger et al. | 427/378 |
| 5,798,323 A * | 8/1998 | Honda et al. | 510/176 |
| 5,800,725 A | 9/1998 | Kato et al. | 216/88 |
| 5,817,185 A | 10/1998 | Shindo et al. | 134/25.4 |
| 5,849,091 A * | 12/1998 | Skrovan et al. | 134/1 |
| 5,855,811 A * | 1/1999 | Grieger et al. | 252/79.3 |
| 5,942,131 A * | 8/1999 | Robinson et al. | 216/99 |
| 5,968,848 A * | 10/1999 | Tanabe et al. | 438/745 |
| 5,972,862 A * | 10/1999 | Torii et al. | 510/175 |
| 5,988,186 A * | 11/1999 | Ward et al. | 134/1.3 |
| 6,012,469 A | 1/2000 | Li et al. | |
| 6,261,845 B1 * | 7/2001 | Verhaverbeke et al. | 436/55 |
| 6,265,781 B1 * | 7/2001 | Andreas | 257/765 |
| 6,280,651 B1 | 8/2001 | Wojtczak et al. | |

FOREIGN PATENT DOCUMENTS

| | | |
|---|---|---|
| EP | 0 812 011 | 12/1997 |
| EP | 0 827 188 | 3/1998 |
| JP | 06-041770 | 2/1994 |
| JP | 07-183288 | 7/1995 |

OTHER PUBLICATIONS

"General Chemistry," Nebergall et al., D.C. Health & Co., 1976, p. 681.

* cited by examiner

Primary Examiner—Robert Kunemund
Assistant Examiner—Lan Vinh
(74) Attorney, Agent, or Firm—Dickstein Shapiro Morin & Oshinsky LLP

(57) ABSTRACT

A method for removing organometallic and organosilicate residues remaining after a dry etch process from semiconductor substrates. The substrate is exposed to a conditioning solution of a fluorine source, a non-aqueous solvent, a complementary acid, and a surface passivation agent. The fluorine source is typically hydrofluoric acid. The non-aqueous solvent is typically a polyhydric alcohol such as propylene glycol. The complementary acid is typically either phosphoric acid or hydrochloric acid. The surface passivation agent is typically a carboxylic acid such as citric acid. Exposing the substrate to the conditioning solution removes the remaining dry etch residues while minimizing removal of material from desired substrate features.

103 Claims, 3 Drawing Sheets

ACID BLEND FOR REMOVING ETCH RESIDUE

FIELD OF THE INVENTION

The present invention relates to the fabrication of semiconductor devices and more particularly to a method for cleaning a semiconductor substrate after the formation of dry etch residues thereon.

BACKGROUND OF THE INVENTION

The importance of minimizing contamination during semiconductor fabrication processes has been recognized since the early days of the industry. As semiconductor devices have become smaller and more complex, cleanliness requirements have become increasingly stringent, especially for devices with submicron critical dimensions, because the ability to reliably create multi-level metallization structures is increasingly vital. The importance of cleaning and conditioning steps during the device fabrication process is also emphasized because small-scale residues that may not have seriously affected the performance of devices with large geometries may result in disabling defects in submicron devices.

Dry etch processes play a key role in developing multi-level metallization structures on semiconductor substrates. The step of transferring the desired pattern from the photoresist into the substrate is often accomplished via a dry etch process. While dry etch processes are effective for selectively etching the substrate in only the areas not masked by photoresist, these processes have a tendency to leave behind residues on the substrate. Although these residues may serve a beneficial role during a dry etch process, they are undesirable after the completion of the dry etch process. In back end of the line processes, where both dielectrics, such as $SiO_2$, and metals, such as Al or W, are present, the residues left behind by dry etch processes may include both organometallic and organosilicate species. These undesirable post-etch residues are often difficult to remove without damaging the desired substrate features.

Current methods for removing dry etch residues have met with only limited success. Traditional cleans involving aqueous acid solutions can not provide a general solution for removing these residues, as these processes are not suitable for processing in the presence of metal lines. Current strategies often involve treating substrates with solutions containing hydroxylamine ($NH_2OH$) and an organic chelating agent. These methods have shown some effectiveness but have significant drawbacks. These types of solutions can cause corrosion of exposed metal on the wafer and usually require long processing times at temperatures near 100 C. These hydroxylamine solutions are also expensive, as the chemicals are not only expensive to purchase but also typically require specialized disposal.

As the removal of dry etch residues grows increasingly troublesome in microelectronic device manufacture, there is a need for an effective method of removal of these residues which can be easily implemented in standard wafer processing equipment and has reduced costs for chemical purchase and disposal.

SUMMARY OF THE INVENTION

The present invention provides an adaptable method for removing organometallic, organosilicate, and other residues from a semiconductor substrate following a dry etch process. A substrate previously subjected to a dry etch process is exposed to a conditioning solution to remove residues remaining after the dry etch. The composition of the conditioning solution can be varied to match specific applications. The conditioning solution generally contains a source of fluorine, a complementary acid, a non-aqueous solvent, and preferably a surface passivation agent. One group of preferred conditioning solutions are solutions composed of HF, $H_3PO_4$, a polyhydric alcohol such as propylene glycol, and a surface passivation agent such as citric acid. In an alternate group of preferred embodiments the conditioning solutions are composed of HF, HCl, a polyhydric alcohol, and a surface passivation agent. The substrate is exposed to the conditioning solution for a sufficient amount of time to remove the undesired residues. After exposing the substrate to the conditioning solution, the substrate is rinsed, preferably by exposing the substrate to a rinse bath of a mildly acidic aqueous solution. Preferably this rinse step also involves bubbling a gas through the rinse bath to agitate the rinse bath.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that structural and chemical changes may be made without departing from the spirit and scope of the present invention.

The terms "wafer" and "substrate" are to be understood as including any semiconductor-based structure having an exposed layer which may be effectively cleaned by the process of the present invention. Typically this will include semiconductor-based structures which have been dry-etched and have resultant organometallic and/or organosilicate residues on an exposed layer, but other structures may also be beneficially treated by the present inventive method. "Wafer" or "substrate" may include silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The following detailed description is, therefore, not to be taken in a limiting sense, and the scope of the present invention is defined by the appended claims. When referring to solutions described herein, the term "percent" refers to the percent measured by weight, e.g., a 90% acetic acid solution is 90% by weight acetic acid.

Figure 1:
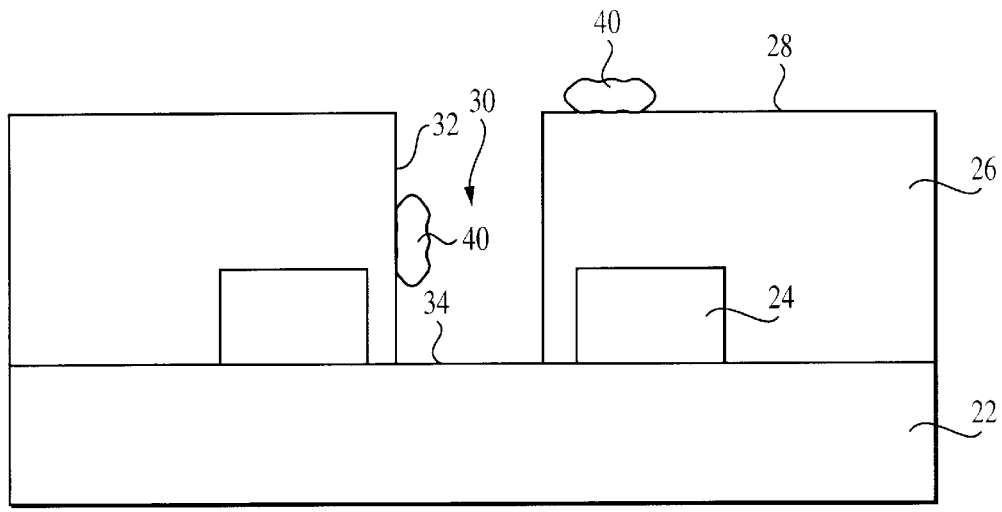
FIG. 1 is a schematic cross-sectional view of a substrate with dry etch residues near a sample device feature.

Referring now to the drawings, where like elements are designated by like reference numerals, FIG. 1 depicts a semiconductor wafer 20 in an intermediate processing stage of a fabrication process. The wafer 20 comprises a substrate 22 with devices 24 located thereon. The devices 24 are covered by a dielectric layer 26 of $SiO_2$, BPSG, or other suitable material which has a top surface 28. A device feature that has been formed by a dry etch process is formed on the substrate 22, either on or in the dielectric layer 26. For exemplary purposes, the device feature will be illustrated and described as a trench 30 which may be a via, but it should be understood that the invention is not limited thereto.

The trench 30 is formed in the dielectric material, and has sidewalls 32 and a bottom surface 34. If trench 30 represents an unfilled via allowing connection between metal levels, the bottom surface 34 may be composed of a metal such as aluminum or tungsten. The wafer 20 of FIG. 1 has been subjected to a dry etch process followed by a photoresist ashing or stripping process. Due to the dry etch process, residues 40, which may be, for example, organosilicate or organometallic residues, are present on the top surface 28 of the dielectric layer 26 and on the sidewalls 32 of the trench 30. If not removed, the residues 40 could prevent proper deposition of subsequent layers in the trench 30 or on the dielectric layer 26.

An embodiment of the present invention for removing residues is illustrated by FIGS. 2 through 5. This embodiment uses a conditioning solution to cleanse the substrate surface after performance of a dry etch. The substrate 22 is exposed to the conditioning solution for a period of time sufficient to remove residues 40 from the substrate surface while minimizing the amount of material removed from exposed surfaces, such as metal lines, vias, or dielectric layers. The composition of the conditioning solution can be varied to match specific applications. The conditioning solution generally contains a fluorine source, a complementary acid, and a non-aqueous solvent. The complementary acid may be $H_3PO_4$, HCl, or another acid or combination of acids which can serve as a pH suppressant. The non-aqueous solvent may be a polyhydric alcohol, such as propylene glycol or ethylene glycol. Alternatively, the non-aqueous solvent may be one of many other suitable organic solvents, including tetrahydrofuran, dimethylsulfoxide, propylene carbonate, or isopropyl alcohol. The conditioning solution preferably also contains a surface passivation agent. The surface passivation agent may be a carboxylic acid, such as citric acid, acetic acid, or EDTA. Other organic acids which are not carboxylic acids may also be suitable, such as ascorbic acid. Preferred conditioning solutions are solutions of HF, $H_3PO_4$, and a polyhydric alcohol such as propylene glycol; solutions of HF, $H_3PO_4$, a polyhydric alcohol, and a surface passivation agent; solutions of HF, HCl, and a polyhydric alcohol; and solutions of HF, HCl, a polyhydric alcohol, and a surface passivation agent such as citric acid.

Although HF is the preferred fluorine source, other fluorine sources may be effectively employed within the scope of this invention. For example, $NH_4F$ might be employed as the fluorine source as long as the $NH_4F$ was compatible with the other components selected for the conditioning solution. Similarly, $H_3PO_4$ is not the only source of phosphate contemplated within the inventive method. For example, phosphate salts which could dissociate to yield $H_2PO_4^-$, $HPO_4^{2-}$, or $PO_4^{3-}$ might be appropriate depending on the other components in the conditioning solution. HF and $H_3PO_4$, however, are particularly preferred and convenient choices for the fluorine source and the complementary acid.

Figure 2:
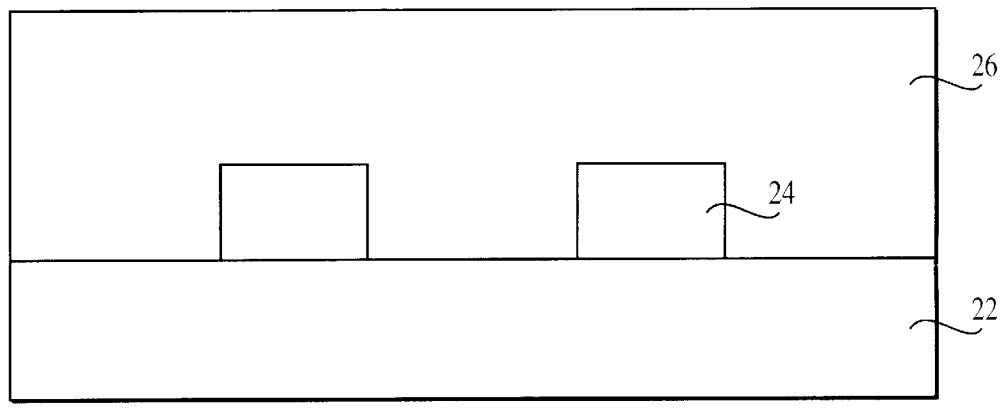
FIG. 2 is a schematic cross-sectional view of a substrate undergoing the process of a preferred embodiment of the invention.

Referring to FIG. 2, the process of the present invention begins subsequent to the formation of devices 24, which may be transistors, capacitors, word lines, bit lines, or the like, on a substrate 22 of a wafer 20 and the formation of a dielectric layer 26 on the substrate 22. The dielectric layer 26 may be a silicon dioxide, borophosphosilicate glass (BPSG), phosphosilicate glass (PSG), borosilicate glass (BSG) or other dielectric layer, and may be deposited by chemical vapor deposition or other suitable means.

Figure 3:
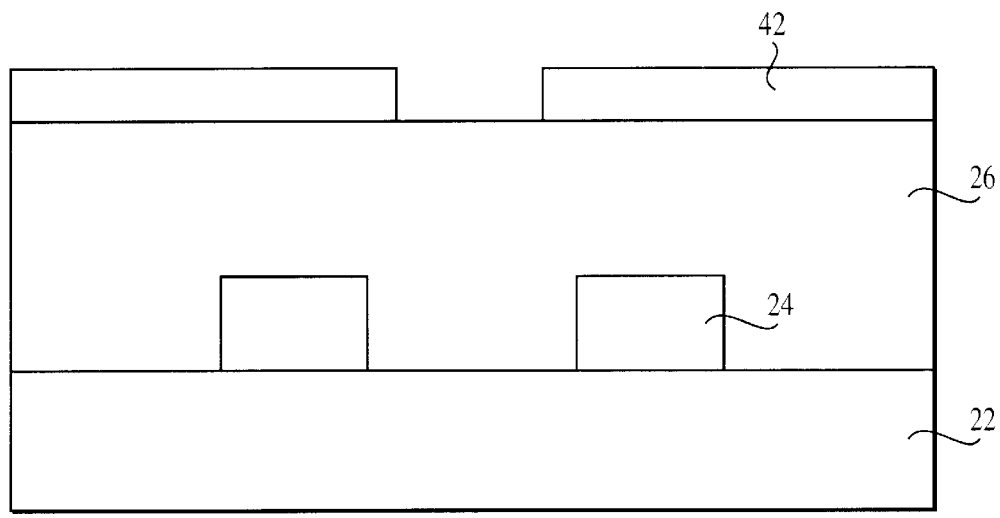
FIG. 3 shows the substrate of FIG. 2 at a processing step subsequent to that shown in FIG. 2.
Figure 4:
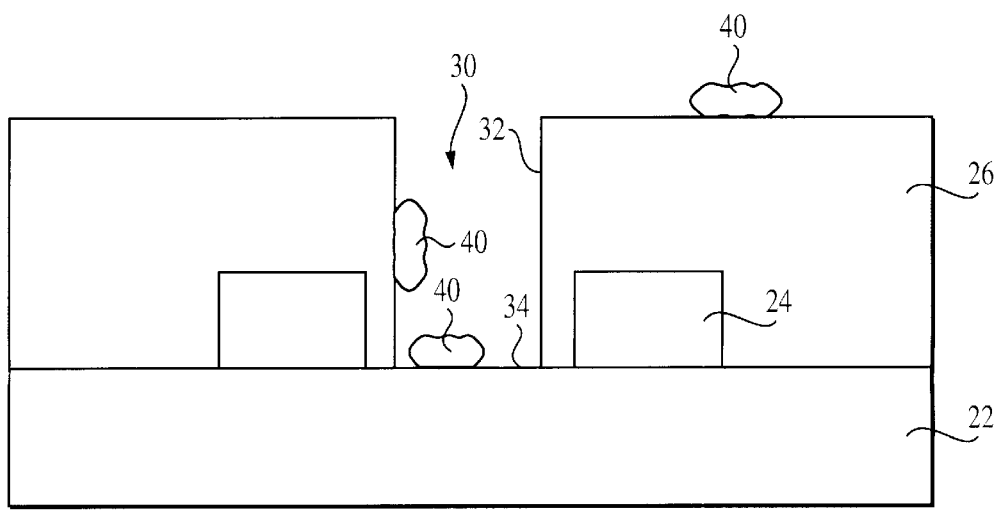
FIG. 4 shows the substrate of FIG. 2 at a processing step subsequent to that shown in FIG. 3.

FIG. 3 depicts the next step of the process, in which a photoresist 42 is formed on the top surface 28 of the dielectric layer 26 by suitable means such as a spin-on technique. The photoresist 42 is patterned and developed, and a dry etch process is performed on the substrate using the patterned photoresist as an etch mask. At the end of the dry etch process, residues 40 are left behind on the substrate. FIG. 4 depicts two possible locations where the residues might reside on the substrate once the remaining photoresist is removed by a suitable process such as ashing or stripping. Residues 40 might remain on the top surface 28 of the dielectric layer 26, or inside the trench 30, as shown in FIG. 4, or potentially at other locations on the wafer.

The wafer 20 is then subjected to the cleansing process of the present invention. The wafer 20 is exposed to a conditioning solution by any suitable method, which is typically a wet processing method. Suitable methods may involve immersion of the wafer 20, either singly or in combination with other wafers, into a bath containing the conditioning solution, or by dispensing of the conditioning solution onto one or more wafers 20 as a stream or spray, so long as such dispensing of the conditioning solution results in exposure of the surface of the substrate to the conditioning solution for the desired length of time. Other methods of treating substrates with the conditioning solution will be apparent to those skilled in the art. The wafer 20 is exposed to the conditioning solution for a time sufficient to remove residues 40 from the top surface 28 of the dielectric layer 26 and from the sidewalls 32 and bottom surface 34 of the trench 30. Residues 40 may be organometallic residues, organosilicate residues, other post-etch residues, or a combination of these residues. The cleansing method of this invention is effective for removal of these residues when present individually or in combination.

The wafer 20 may then be rinsed to prepare the substrate for a subsequent process step. In one embodiment, the substrate is rinsed with deionized water. In a preferred embodiment, the substrate may be exposed to an acidic rinse composed of an aqueous solution of a suitable acid. Carboxylic acids such as citric acid, acetic acid, or EDTA (ethylene diamine tetraacetic acid) are preferred for this embodiment. Other organic acids which are not carboxylic acids may also be used, such as ascorbic acid.

In another embodiment, the aqueous acid solution may be buffered to raise the pH of the solution to any desired pH level up to approximately pH 8. In yet another embodiment, anti-etch agents may be added to the rinse bath, such as ammonium lactate or boric acid. In another embodiment, the substrate may be rinsed by exposing the wafer to an organic solvent, such as an alcohol, a polyhydric alcohol (such as propylene glycol), a ketone, or a fluorocarbon. In another embodiment, the rinse may be carried out in a bath and the rinse bath may be agitated by introduction of a gas. The agitating gas may be $CO_2$, $N_2$, or other gases which can be conveniently introduced into the rinse bath for agitation. In yet another embodiment, the solution may be agitated using megasonic energy. In still another embodiment, the solution may be agitated by manual or robot-controlled shaking of the vessel containing the rinse bath.

Use of the acidified rinse or buffered rinse greatly reduces the potential for unwanted consumption of the desired substrate materials after exposing the wafer to the conditioning solution. In embodiments where rinsing is accomplished with a rinse bath, a gas may be bubbled through the rinse bath. When the gas is $CO_2$, introduction of the gas provides another means for acidifying the rinse water as well due to the formation of carbonic acid. When the rinse is already acidified, however, inert gases such as $N_2$ exhibit similar effectiveness to $CO_2$. In some applications of this method, either the wafer may not be susceptible to the unwanted consumption of the substrate or additional loss of substrate material may not be critical. In these cases the wafer may be rinsed with deionized water.

In still another embodiment, the wafer 20 may be pre-rinsed with a non-aqueous solvent prior to the rinse step. In one embodiment, the non-aqueous solvent is a polyhydric alcohol, such as propylene glycol. In another embodiment, the wafer is pre-rinsed with the same non-aqueous solvent used in the conditioning solution. After pre-rinsing the wafer with a non-aqueous solvent, the wafer may be rinsed with any of the rinses described above.

Figure 5:
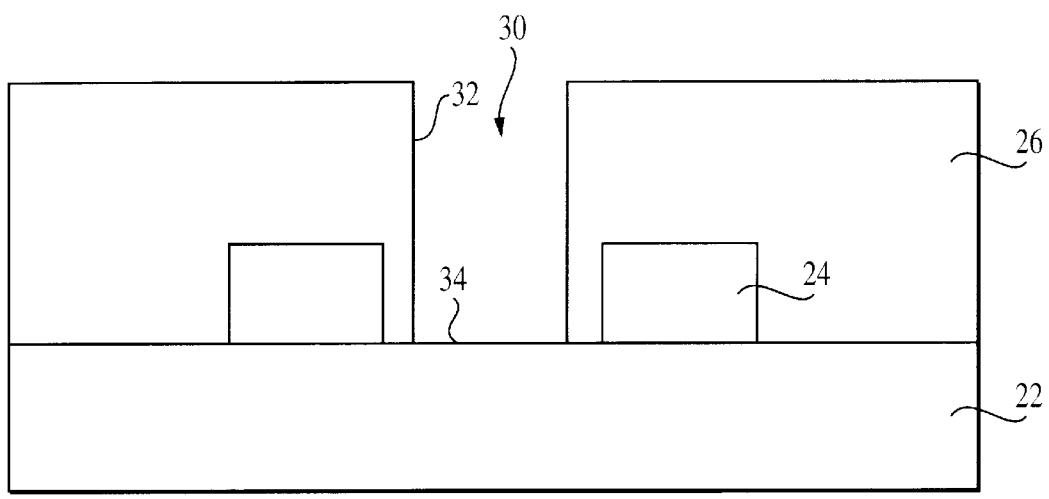
FIG. 5 shows the substrate of FIG. 2 at a processing step subsequent to that shown in FIG. 4.

The exact nature and length of the rinse step may vary depending on the next process step the substrate will undergo. The wafer 20 may be spin-dried after rinsing, if appropriate. The final structure of the wafer 20 with the residue removed is shown in FIG. 5. Further steps to create a functional circuit from the wafer 20 may now be carried out.

Typically the conditioning solution is composed of a fluorine source, a complementary acid, a non-aqueous solvent, and a surface passivation agent. The fluorine source may be HF, $NH_4F$, or other suitable chemicals which can act as fluorine sources in the conditioning solution. The non-aqueous solvent is typically a polyhydric alcohol, such as propylene glycol or ethylene glycol. Other organic solvents may also be used, such as tetrahydrofuran, dimethylsulfoxide, propylene carbonate, or isopropyl alcohol. In many embodiments, propylene glycol is preferred due to considerations of low health exposure risk and ease of disposal. Blends of more than one alcohol may also be used. The complementary acid may be $H_3PO_4$, HCl, or another acid or combination of acids which may act as a pH suppressant. Preferably, the acid or combination of acids selected as the pH suppressant should be able to reduce the pH of the solution to below pH 2. The surface passivation agent is typically a carboxylic acid. Preferred carboxylic acids include citric acid, acetic acid, or EDTA. Other organic acids which are not carboxylic acids may also be used, such as ascorbic acid. Other surface passivation agents will be apparent to those skilled in the art. Other surface passivation agents could generally include chelants or reducing agents.

In one series of embodiments, the conditioning solution is composed of HF as the fluorine source, propylene glycol as the non-aqueous solvent, $H_3PO_4$ as the complementary acid, and citric acid as the surface passivation agent. In one embodiment, the conditioning solution is composed of approximately 0.01 percent to approximately 5.0 percent HF, approximately 80 percent to approximately 95 percent propylene glycol, approximately 1 percent to approximately 15 percent $H_3PO_4$, and approximately 0.001 percent to approximately 1.0 percent citric acid. In a preferred embodiment, the conditioning solution is composed of approximately 0.25 percent to approximately 0.3 percent HF, approximately 89 percent to approximately 94 percent propylene glycol, approximately 6 percent to approximately 7 percent $H_3PO_4$, and approximately 0.09 percent to approximately 0.50 percent citric acid. In a particularly preferred embodiment, the conditioning solution is composed of approximately 0.27 percent HF, approximately 91.5 percent propylene glycol, approximately 6.5 percent $H_3PO_4$, and approximately 0.25 percent citric acid.

In the above conditioning solutions the balance of the solution weight is made up by water. In many embodiments the conditioning solution is prepared by combining stock acid solutions which contain water, so a small amount of water may be present in the conditioning solution. It is preferred, however, that the water content of the conditioning solution be as low as possible.

In another series of embodiments, the conditioning solution is prepared by choosing HF as the fluorine source, HCl as the complementary acid, propylene glycol as the non-aqueous solvent, and citric acid as the surface passivation agent. In an embodiment, the conditioning solution is composed of approximately 0.01 percent to approximately 5.0 percent HF, approximately 80 percent to approximately 99 percent propylene glycol, approximately 0.003 percent to approximately 1.0 percent HCl, and approximately 0.001 percent to approximately 1.0 percent citric acid. In a preferred embodiment, the conditioning solution is composed of approximately 0.25 percent to approximately 0.3 percent HF, approximately 90 percent to approximately 98 percent propylene glycol, approximately 0.005 percent to approximately 0.009 percent HCl, and approximately 0.09 percent to approximately 0.5 percent citric acid. In a particularly preferred embodiment, the conditioning solution is composed of approximately 0.27 percent HF, approximately 97.5 percent propylene glycol, approximately 0.006 percent HCl, and approximately 0.25 percent citric acid.

Once again, the balance of the solution weight in the above conditioning solutions is made up by water. In many embodiments, the conditioning solution is prepared by combining stock acid solutions which contain water, so a small amount of water may be present in the conditioning solution. It is preferred, however, that the water content of the conditioning solution be as low as possible.

In another series of embodiments, the surface passivation agent may be omitted from the conditioning solution. The conditioning solution will still effectively remove any organometallic, organosilicate, and other post-etch residues if the surface passivation agent is omitted. In these embodiments, however, the risk of damage to features on the surface of the substrate is substantially increased. While these embodiments may be effectively employed, greater care must be taken with other reaction parameters such as processing time and temperature in order to avoid potential damage to desired surface features or the substrate.

Residue removal with the conditioning solution may be performed at temperatures of approximately 5 to approximately 60 degrees Celsius. Temperatures below 5 degrees Celsius may be used, but are not as favorable due to decreased residue removal speeds. As a result, at lower temperatures the conditioning solution may need to be applied to the substrate for longer periods of time, leading to lower throughput in a production setting. Temperatures above 60 degrees Celsius may also be used. Preferably, the substrate is exposed to the conditioning solution at a temperature of approximately 35 to approximately 40 degrees Celsius. Exposing the substrate to the conditioning solution at a temperature of approximately 38 degrees Celsius is a particularly preferred embodiment of this invention.

Preferably, the substrate is exposed to the conditioning solution for a period of time sufficient to remove any undesirable dry etch residues from the surface of the substrate. This may involve an exposure of the substrate to the conditioning solution for periods of time ranging from about 10 seconds to about 60 seconds or longer depending on the exact nature of the substrate and the process temperature. Longer exposure times, such as about 180 seconds or longer, allow for greater removal efficiency of the dry etch residues but will also lead to lower throughput in a production setting. Also, depending on the exact nature of the substrate, longer exposures to the conditioning solution may eventually lead to removal of material from exposed features on the surface of the substrate, such as metal lines, vias, or dielectric surfaces. As a result, the optimal amount of time for exposure of a substrate to the conditioning solution will be substrate dependent. The preferred exposure time could be near 10 seconds, near 60 seconds, near 180 seconds, or a longer or shorter period of time depending on the exact nature of the target substrate as well as the residues targeted for removal.

The substrate may be treated with the conditioning solution by immersing the substrate in a bath of the conditioning solution. Alternatively, the substrate may be treated with the conditioning solution by dispensing the solution on to the substrate, such as by a spray technique. Other methods for exposing the substrate to the conditioning solution will be apparent to those skilled in the art.

Without being bound by any particular theory, it is currently believed that several factors contribute to the effectiveness of this method for removing dry etch residues. It is believed that the carboxylic acid or other organic acid plays a role by passivating the surface of exposed metal lines, especially aluminum lines, which are on the surface of the substrate. In embodiments where the conditioning solution includes phosphoric acid, it is believed that the $H_3PO_4$ and HF play complementary roles of aiding in the removal of organometallic and organosilicate residues, respectively. In embodiments where a pH suppressant is present, it is believed that the low pH of the conditioning solution tends to allow hydrofluoric acid present in the solution to exist as molecular HF and $H_2F_2$, as opposed to undergoing dissociation into $H^+$, $F^-$, $HF^{2-}$, or any of the other likely species produced when HF dissociates in solution. By preventing dissociation of the HF present in the conditioning solution, the HF is forced to remain in its molecular form which generally reacts much more slowly with substrate materials such as $SiO_2$ or the aluminum lines likely to be exposed on a substrate surface.

An alternate theory which could explain the lack of reactivity with the aluminum lines is that the nature of the conditioning solution suppresses the solubility of aluminum fluoride. Aluminum fluoride is one of the likely products of any reaction involving aluminum lines on the surface of the substrate. Lowering the solubility of aluminum fluoride might cause this reaction product to build up at the surface of the aluminum lines and prevent further reaction.

As can be seen from the embodiments described herein, the present invention encompasses processes of removing dry etch residues from substrates having exposed areas of metal and/or dielectric. In one embodiment the substrate is treated with/exposed to an conditioning solution composed of a fluorine source such as HF, a non-aqueous solvent, which is typically a polyhydric alcohol such as propylene glycol, a complementary acid, which could include $H_3PO_4$, HCl, or other pH suppressants, and a surface passivation agent, which is typically a carboxylic acid such as citric acid. The conditioning solution efficiently removes organometallic, organosilicate, and other dry etch residues with minimal impact on exposed features on the substrate surface.

The above description and drawings are only illustrative of preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method for processing a semiconductor substrate, the method comprising:
   performing a dry etch process on said semiconductor substrate; and
   removing dry etch residues from said semiconductor substrate by exposing said semiconductor substrate to a conditioning solution, wherein the conditioning solution comprises:
   a fluorine source,
   a complementary acid,
   a non-aqueous solvent selected from the group consisting of tetrahydrofuran, propylene carbonate, and blends thereof, and
   a surface passivation agent comprising ethylene diamine tetraacetic acid or ascorbic acid;
   wherein said conditioning solution is substantially free of water, and said fluorine source, said complementary acid, said non-aqueous solvent and said passivation agent are present in said conditioning solution in concentrations suitable for the selective removal of said residues relative to any exposed metal on said semiconductor substrate.

2. The method of claim 1, wherein the fluorine source is HF.

3. The method of claim 1, wherein the fluorine source is $NH_4F$.

4. The method of claim 1, wherein the complementary acid is $H_3PO_4$.

5. The method of claim 1, wherein the complementary acid is a phosphate salt.

6. The method of claim 1, wherein the complementary acid is HCl.

7. The method of claim 1, wherein the complementary acid is a pH suppressant.

8. The method of claim 1, wherein the surface passivation agent contributes to said selective removal by said solution by passivating any exposed metal on said semiconductor substrate.

9. The method of claim 1, wherein the fluorine source contributes to said selective removal by said solution by substantially remaining in molecular form.

10. The method of claim 9, wherein the complementary acid is present in sufficient amount to contribute to said fluorine source substantially remaining in molecular form.

11. The method of claim 1, wherein the non-aqueous solvent is tetrahydrofuran.

12. The method of claim 1, wherein the fluorine source, the complementary acid, the non-aqueous solvent, and the surface passivation agent are present in said solution in sufficient concentrations to suppress the solubility of aluminum fluoride.

13. The method of claim 1, wherein the non-aqueous solvent is propylene carbonate.

14. The method of claim 1, wherein the fluorine source is an organosilicate-removing agent and the complementary acid is an organometallic-removing agent.

15. The method of claim 1, wherein the fluorine source is HF and the complementary acid is HCl.

16. The method of claim 1, wherein the surface passivation agent is ascorbic acid.

17. The method of claim 1, wherein the surface passivation agent comprises a chelant.

18. The method of claim 1, wherein the surface passivation agent comprises a reducing agent.

19. The method of claim 1, wherein said act of removing comprises exposing said substrate at a temperature within the range of approximately 5 to approximately 60 degrees Celsius.

20. The method of claim 1, wherein said act of removing comprises exposing said substrate at a temperature within the range of approximately 35 to approximately 40 degrees Celsius.

21. The method of claim 1, wherein said act of removing comprises exposing said substrate at a temperature of approximately 38 degrees Celsius.

22. The method of claim 1, wherein said act of removing further comprises immersing the substrate in the conditioning solution.

23. The method of claim 1, wherein said act of removing further comprises dispensing the conditioning solution onto the substrate.

24. The method of claim 1, wherein said act of removing comprises exposing said substrate for a time sufficient to remove substantially all dry etch residues from the substrate.

25. The method of claim 1, wherein said act of removing comprises exposing said substrate for approximately 10 seconds or longer.

26. The method of claim 1, wherein said act of removing comprises exposing said substrate for approximately 60 seconds or longer.

27. The method of claim 1, wherein the complementary acid is $H_3PO_4$.

28. The method of claim 1, wherein the complementary acid is phosphate.

29. The method of claim 1, wherein the complementary acid is HCl.

30. The method of claim 1, wherein the complementary acid is a pH suppresant.

31. The method of claim 1, wherein the conditioning solution is comprised of approximately 0.01 to approximately 5.0 percent-by-weight of the fluorine source, approximately 80 to approximately 90 percent-by-weight of the non-aqueous solvent, approximately 1 to approximately 15 percent-by-weight of the complementary acid, and approximately 0.001 to approximately 1.0 percent-by-weight of the surface passivation agent.

32. The method of claim 1, wherein the conditioning solution is comprised of approximately 0.01 to approximately 5.0 percent-by-weight of the fluorine source, approximately 80 to approximately 95 percent-by-weight of the non-aqueous solvent, approximately 0.003 to approximately 1.0 percent-by-weight of the complementary acid, and approximately 0.001 to approximately 1.0 percent-by-weight of the surface passivation agent.

33. The method of claim 1, wherein the fluorine source is HF and the complementary acid is $H_3PO_4$.

34. The method of claim 33, wherein the HF, non-aqueous solvent, and $H_3PO_4$ are present in the conditioning solution in the approximate proportion of 0.01–5.0:80–95:1–15.

35. The method of claim 33, wherein the HF, non-aqueous solvent, and $H_3PO_4$ are present in the conditioning solution in the approximate proportion of 0.25–0.3:89–94:6–7.

36. The method of claim 33, wherein the HF, non-aqueous solvent, and $H_3PO_4$ are present in the conditioning solution in the approximate proportion of 0.27:91.5:6.5.

37. The method of claim 15, wherein the HF, non-aqueous solvent, and HCl are present in the conditioning solution in the approximate proportion of 0.01–5.0:80–99:0.003–1.0.

38. The method of claim 15, wherein the HF, non-aqueous solvent, and HCl are present in the conditioning solution in the approximate proportion of 0.25–0.3:93–98:0.005–0.009.

39. The method of claim 15, wherein the HF, non-aqueous solvent, and HCl are present in the conditioning solution in the approximate proportion of 0.27:97.5:0.006.

40. The method of claim 33, wherein the HF, non-aqueous solvent, $H_3PO_4$, and surface passivation agent are present in the conditioning solution in the approximate proportion of 0.01–5.0:80–95:1–15:0.001–1.0.

41. The method of claim 33, wherein the HF, non-aqueous solvent, $H_3PO_4$, and surface passivation agent are present in the conditioning solution in the approximate proportion of 0.25–0.3:89–94:6–7:0.09–0.5.

42. The method of claim 33, wherein the HF, non-aqueous solvent, $H_3PO_4$, and surface passivation agent are present in the conditioning solution in the approximate proportion of 0.27:91.5:6.5:0.25.

43. The method of claim 15, wherein the HF, non-aqueous solvent, HCl, and surface passivation agent are present in the conditioning solution in the approximate proportion of 0.01–5.0:80–99:0.003–1.0:0.001–1.0.

44. The method herein the HF, non-aqueous solvent, HCl, and surface passivation agent are present in the conditioning solution in the approximate proportion of 0.25–0.3:93–98:0.005–0.009:0.09–0.5.

45. The method of claim 15 wherein the HF, non-aqueous solvent, HCl, and surface passivation agent are present in the conditioning solution in the approximate proportion of 0.27:97.5:0.006:0.25.

46. The method of claim 1, further comprising rinsing the substrate after said act of removing.

47. The method of claim 46, wherein said act of rinsing comprises exposing the substrate to deionized water.

48. The method of claim 46, wherein said act of rinsing comprises exposing the substrate to an aqueous acid solution.

49. The method of claim 48, wherein the aqueous acid solution is a solution of a carboxylic acid.

50. The method of claim 48, wherein the aqueous acid solution is a solution of citric acid.

51. The method of claim 48, wherein the aqueous acid solution is a solution of EDTA.

52. The method of claim 48, wherein the aqueous acid solution is a solution of acetic acid.

53. The method of claim 48, wherein the aqueous acid solution is a solution of an organic acid.

54. The method of claim 48, wherein the aqueous acid solution is a solution of ascorbic acid.

55. The method of claim 48, wherein the aqueous acid solution is a solution of carbonic acid.

56. The method of claim 48, wherein the aqueous acid solution is buffered to a pH between approximately 4.0 and approximately 8.0.

57. The method of claim 46, wherein said act of rinsing comprises exposing the substrate to an organic solvent.

58. The method of claim 57, wherein the organic solvent is propylene glycol.

59. The method of claim 46, wherein said act of rinsing comprises exposing the substrate to a solution containing an anti-etch agent.

60. The method of claim 59, wherein the anti-etch agent is ammonium lactate.

61. The method of claim 59, wherein the anti-etch agent is boric acid.

62. The method of claim 46, wherein said act of rinsing further comprises immersing the substrate in a rinse bath.

63. The method of claim 62, wherein said act of rinsing further comprises agitating the rinse bath.

64. The method of claim 63, wherein the rinse bath is agitated with megasonic energy.

65. The method of claim 63, wherein the rinse bath is agitated by bubbling a gas through the rinse bath.

66. The method of claim 65, wherein $CO_2$ is bubbled through the rinse bath.

67. The method of claim 65, wherein $N_2$ is bubbled through the rinse bath.

68. The method of claim 46, further comprising pre-rinsing the substrate with a second non-aqueous solvent subsequent to said act of removing but prior to said act of rinsing.

69. The method of claim 68, wherein the second non-aqueous solvent is a polyhydric alcohol.

70. The method of claim 68, wherein the second non-aqueous solvent is propylene glycol.

71. The method of claim 68, wherein the second non-aqueous solvent is the same non-aqueous solvent used in the conditioning solution.

72. A method for processing a wafer, the method comprising:
performing a dry etch process on said wafer; and
removing at least one of organometallic and organosilicate residues of said dry etch process from exposed surfaces of said wafer by treating the wafer with a conditioning solution comprising:
a fluorine-containing organosilicate-removing agent,
a non-aqueous solvent selected from the group consisting of tetrahydrofuran, propylene carbonate, and blends thereof,
an organometallic-removing complementary acid, and
a surface passivation agent comprising ethylene diamine tetraacetic acid or ascorbic acid;
wherein said conditioning solution is substantially free of water, and said organosilicate-removing agent, said organometallic-removing complementary acid, said non-aqueous solvent and said passivation agent are present in said conditioning solution in concentrations suitable for the selective removal of said residues relative to any exposed metal on said semiconductor substrate.

73. The method of claim 72, further comprising rinsing the substrate after said act of removing.

74. The method of claim 72, wherein the fluorine-containing organosilicate-removing agent is HF and the organometallic-removing complementary acid is HCl.

75. The method of claim 74, where the HF, the non-aqueous solvent, the HCl, and surface passivation agent are present in the conditioning solution in the approximate proportion 0.01–5.0:80–99:0.003–1.0:0.001–1.0.

76. The method of claim 74, where the HF, the non-aqueous solvent, the HCl, and surface passivation agent are present in the conditioning solution in the approximate proportion 0.25–0.3:90–98:0.005–0.009:0.009–0.5.

77. The method of claim 74, where the HF, the non-aqueous solvent, the HCl, and surface passivation agent are present in the conditioning solution in the approximate proportion 0.27:97.5:0.006:0.25.

78. The method of claim 72, wherein the fluorine-containing organosilicate-removing agent is HF and the organometallic-removing complementary acid is $H_3PO_4$.

79. The method of claim 78, where the HF, the non-aqueous solvent, the $H_3PO_4$, and the surface passivation agent are present in the conditioning solution in the approximate proportion 0.01–5.0:80–95:1–15:0.001–1.0.

80. The method of claim 78, where the HF, the non-aqueous solvent, the $H_3PO_4$, and the surface passivation agent are present in the conditioning solution in the approximate proportion 0.25–0.3:89–94:6–7:0.009–0.5.

81. The method of claim 78, where the HF, the non-aqueous solvent, the $H_3PO_4$, and the surface passivation agent are present in the conditioning solution in the approximate proportion 0.27:91.5:6.5:0.25.

82. The method of claim 72, wherein said act of removing comprises treating said wafer at a temperature within the range of approximately 5 to approximately 60 degrees Celsius.

83. The method of claim 72, wherein said act of removing comprises treating said wafer at a temperature within the range of approximately 35 to approximately 40 degrees Celsius.

84. The method of claim is 72, wherein said act of removing comprises treating said wafer at a temperature of approximately 38 degrees Celsius.

85. The method of claim 72, wherein said act of removing comprises treating said wafer for approximately 60 seconds or longer.

86. A method for processing a substrate with patterned photoresist on the substrate surface comprising the steps of:
providing a substrate with patterned photoresist on a surface of the substrate;
performing a dry etch process on the substrate, wherein said dry etch process leaves at least one of organometallic and organosilicate residues on said substrate;
removing any remaining photoresist from the surface of the substrate; and
removing the dry etch residues from the substrate by exposing the substrate to a conditioning solution, said conditioning-solution being a substantially water-free composition suitable for the selective removal of said residues relative to any exposed metal on said semiconductor substrate and comprising:
a fluorine-containing organosilicate-removing agent, said fluorine-containing organosilicate-removing agent-contributing to the selective removal by said conditioning solution by substantially remaining in molecular form;
a non-aqueous solvent selected from the group consisting of tetrahydrofuran, propylene carbonate, and blends thereof;
an organometallic-removing complementary acid present in sufficient amount to contribute to said fluorine-containing organosilicate-removing agent substantially remaining in molecular form; and
a surface passivation agent comprising ethylene diamine tetraacetic acid or ascorbic acid, said surface passivation agent contributing to the selective removal by said conditioning solution by passivating said any exposed metal on said semiconductor substrate.

87. The method of claim 86, further comprising rinsing the substrate after said act of removing dry etch residues.

88. The method of claim 86, wherein the fluorine-containing organosilicate-removing agent is HF and the organometallic-removing complementary acid is HCl.

89. The method of claim 88, where the HF, the non-aqueous solvent, the HCl, and the surface passivation agent are present in the conditioning solution in the approximate proportion 0.01–5.0:80–99:0.003–1.0:0.001–1.0.

90. The method of claim 88, where the HF, the non-aqueous solvent, the HCl, and the surface passivation agent are present in the conditioning solution in the approximate proportion 0.25–0.3:90–98:0.005–0.009:0.009–0.5.

91. The method of claim 88, where the HF, the non-aqueous solvent, the HCl, and the surface passivation agent are present in the conditioning solution in the approximate proportion 0.27:97.5:0.006:0.25.

92. The method of claim 86, wherein the fluorine-containing organosilicate-removing agent is HF and the organometallic-removing complementary acid is $H_3PO_4$.

93. The method of claim 92, where the HF, the non-aqueous solvent, the $H_3PO_4$, and the surface passivation agent are present in the conditioning solution in the approximate proportion 0.01–5.0:80–95:1–15:0.001–1.0.

94. The method of claim 92, where the HF, the non-aqueous solvent, the $H_3PO_4$, and the surface passivation agent are present in the conditioning solution in the approximate proportion 0.25–0.3:89–94:6–7:0.009–0.5.

95. The method of claim 92, where the HF, the non-aqueous solvent, the $H_3PO_4$, and the surface passivation agent are present in the conditioning solution in the approximate proportion 0.27:91.5:6.5:0.25.

96. The method of claim 86, wherein said act of removing dry etch residues comprises exposing said substrate at a temperature within the range of approximately 5 to approximately 60 degrees Celsius.

97. The method of claim 86, wherein said act of removing dry etch residues comprises exposing said substrate at a temperature within the range of approximately 35 to approximately 40 degrees Celsius.

98. The method of claim 86, wherein said act of removing dry etch residues comprises exposing said substrate at a temperature of approximately 38 degrees Celsius.

99. The method of claim 86, wherein said act of removing dry etch residues comprises exposing said substrate for approximately 60 seconds or longer.

100. A method for treating a semiconductor substrate, the method comprising:

performing a dry etch process on said semiconductor substrate; and removing at least one of organometallic and organosilicate residues of said dry etch process remaining on exposed surfaces of the substrate while minimizing the removal of metal lines from said exposed surfaces by exposing the substrate to a substantially non-aqueous conditioning solution comprising HF, at least one of tetrahydrofuran or propylene carbonate, HCl, and at least one of ethylene diamine tetraacetic acid or ascorbic acid as a passivation agent in the approximate respective percentage-by-weight ratio 0.01–5.0:80–95:0.003–1.0:0.001–1.0.

101. A method for treating a semiconductor substrate, the method comprising:

performing a dry etch process on said semiconductor substrate; and removing at least one of organometallic and organosilicate residues of said dry etch process remaining on exposed surfaces of the substrate while minimizing the removal of metal lines from said exposed surfaces by exposing the substrate to a substantially non-aqueous conditioning solution comprising HF, at least one of tetrahydrofuran or propylene carbonate, $H_3PO_4$, and at least one. of ethylene diamine tetraacetic acid or ascorbic acid as a passivation agent in the approximate respective percentage-by-weight ratio 0.01–5.0:80–90:1–15:0.001–1.0.

102. A method for treating a semiconductor substrate, the method comprising:

performing a dry etch process on said semiconductor substrate;

removing at least one of organometallic and organosilicate residues of said dry etch process remaining on exposed surfaces of the substrate while minimizing the removal of metal lines from said exposed surfaces by exposing the substrate to a substantially non-aqueous conditioning solution comprising HF, at least one of tetrahydrofuran or propylene carbonate, HCl, and at least one of ethylene diamine tetraacetic acid or ascorbic acid as a passivation agent in the approximate respective percentage-by-weight ratio 0.25–0.3:90–98:0.0050–0.009:0.009–0.5; and rinsing the substrate.

103. A method for treating a semiconductor substrate, the method comprising:

performing a dry etch process on said semiconductor substrate;

removing at least one of organometallic and organosilicate residues of said dry etch process remaining on exposed surfaces of the substrate while minimizing the removal of metal lines from said exposed surfaces by exposing the substrate to a substantially non-aqueous conditioning solution comprising HF, at least one of tetrahydrofuran or propylene carbonate, $H_3PO_4$, and at least one of ethylene diamine tetraacetic acid or ascorbic acid as a passivation agent in the approximate respective percentage-by-weight ratio 0.25–0.3:90–94:6–7:0.009–0.5; and rinsing the substrate.

* * * * *

UNITED STATES PATENT AND TRADEMARK OFFICE
CERTIFICATE OF CORRECTION

PATENT NO. : 6,562,726 B1
DATED : May 13, 2003
INVENTOR(S) : Kevin J. Torek et al.

It is certified that error appears in the above-identified patent and that said Letters Patent is hereby corrected as shown below:

Column 10,
Line 39, "claim herein" should read -- claim is, wherein --

Signed and Sealed this

Second Day of September, 2003

JAMES E. ROGAN
*Director of the United States Patent and Trademark Office*

UNITED STATES PATENT AND TRADEMARK OFFICE
CERTIFICATE OF CORRECTION

PATENT NO.     : 6,562,726 B1
DATED          : May 13, 2003
INVENTOR(S)    : Kevin J. Torek et al.

It is certified that error appears in the above-identified patent and that said Letters Patent is hereby corrected as shown below:

<u>Column 10,</u>
Line 39, "claim herein" should read -- claim 15, wherein --

This certificate supersedes Certificate of Correction issued September 2, 2003.

Signed and Sealed this

Twentieth Day of April, 2004

JON W. DUDAS
*Acting Director of the United States Patent and Trademark Office*